United States Patent [19]

Ravinet et al.

[11] 4,401,911

[45] Aug. 30, 1983

[54] ACTIVE SUSPENSION PIEZOELECTRIC POLYMER TRANSDUCER

[75] Inventors: Pierre Ravinet; François Micheron, both of Paris, France

[73] Assignee: Thomson-CSF, Paris, France

[21] Appl. No.: 239,642

[22] Filed: Mar. 2, 1981

[30] Foreign Application Priority Data

Mar. 4, 1980 [FR] France ........................ 80 04838

[51] Int. Cl.[3] ........................ H01L 41/08

[52] U.S. Cl. ........................ 310/800; 310/334; 179/110 A

[58] Field of Search ........................ 310/800, 367, 334; 179/110 A

[56] References Cited

U.S. PATENT DOCUMENTS

| | | | |
|---|---|---|---|
| 3,816,774 | 6/1974 | Ohnuki et al. | 310/800 X |
| 3,947,644 | 3/1976 | Uchlkawa | 310/800 X |
| 4,284,921 | 8/1981 | Lemonon et al. | 310/800 X |

FOREIGN PATENT DOCUMENTS

| | | | |
|---|---|---|---|
| 2070891 | 9/1981 | United Kingdom | 179/110 A |

*Primary Examiner*—Mark O. Budd

*Attorney, Agent, or Firm*—Cushman, Darby & Cushman

[57] ABSTRACT

An electromechanical transducer comprising a radiating structure whose active element is formed by a polymer film placed between two electrodes.

The invention provides a transducer in which a closure element having the exact shape of a spherical surface portion is connected to at least one active peripheral suspension which simulates the movements of a pulsating sphere portion completing the closure element.

13 Claims, 14 Drawing Figures

ACTIVE SUSPENSION PIEZOELECTRIC POLYMER TRANSDUCER

BACKGROUND OF THE INVENTION

The present invention relates to electromechanical transducers comprising a polymer element in which an electrical anisotropy has been introduced in the form of an excess electric charge or a dipolar orientation of the macromolecular chains. The invention relates more particularly to transducers such as loudspeakers, microphones, hydrophones, probes for echography, etc. in which the active structure is formed by at least a polymer film having been subjected to shaping of a non-developable type. Such a structure is self-supporting and requires no other support than peripheral securing. In practice, two modes of deformation are met with according as to whether the lamellar structure is homogeneous or heterogenous. The simplest example is that of a single film carrying metalizations on both its flat faces. Such a film, subjected to an energizing electric field, is deformed in three directions which are normal to its faces and two directions contained in its plane. In the case of a dimorphous structure formed from two films which adhere together, it is sufficient for the induced deformations to differ from one another for the whole to bend.

Apart from the thickness deformation, the other deformations depend on the stretching that the film has undergone during shaping. When the stretching is unidirectional, the deformations are greater in the stretching direction. On the contrary, in the absence of stretching or when the stretching is isotropic, the deformations are also isotropic.

In transducers using as active element a portion of a sphere, the peripheral securing opposes locally any circumferential deformation so that the movement depends largely on the buttressing effect which is exerted along the meridian lines. By replacing the peripheral securing with a passive annular undulating suspension, more freedom is given to the structure, but the vibrating-piston effect is still far from approaching the radial movement which characterizes a pulsating spherical surface. The result is a loss of efficiency and radiation fairly different from that of a pinpoint source.

SUMMARY OF THE INVENTION

The invention provides an electromechanical transducer with a self-supporting radiating structure comprising at least one active element in the form of at least one film of a polymer material, this radiating structure being provided with at least one marginal attachment serving as a support, characterized in that this radiating structure comprises at least one active suspension having two edges connected by an active wall; the first edge being connected to this attachment; the second edge of this active suspension being joined to an element for closing this radiating structure; this closure element being formed by a film which takes on exactly the shape of a spherical-surface portion; the movement of the second circular edge of the active suspension being directed along marginal radii of this spherical surface portion.

The invention also provides the process for manufacturing the above-mentioned electromechanical transducer.

DESCRIPTION OF THE DRAWINGS

The invention will be better understood from the following description and accompanying figures in which.

DESCRIPTION OF THE PREFERRED EMBODIMENTS

Before entering into details in the description, it is useful to recall that the electromechanical transducers considered are excited electrically through a system of electrodes and emit through a radiating surface coupled to media propagating longitudinal vibrating waves. However, these linear transducers also operate in the opposite direction. The transducer effects induced in polar polymer films are piezoelectric effects. For nonpolar polymer films, a permanent excess charge can be induced which linearizes attraction effects of electric charges and leads to transducer behavior related to the piezoelectric effect. According to the construction of the polymer structure, the deformation of an active element may produce essentially an isotropic or anisotripic surface variation with corresponding curvature change if necessary (case of the homogeneous structure) or on the contrary accumulative bending accompanied by transverse movement (case of the dimorphous structure).

The polymer materials usable are polar homopolymers such as $PVF_2$ (vinylidene polyfluoride) and PVF (vinyl polyfluoride) or else polar copolymers such as $PVF_2$-PTFE. Nonpolar polymer materials are also usable with an excess electric charge obtained by implantation, by thermal electrification or by corona discharge. Many organic synthetic dielectrics are usable such as polyurethane (PU) and ethylene polytetrafluoride (PTFE).

Figure 1:
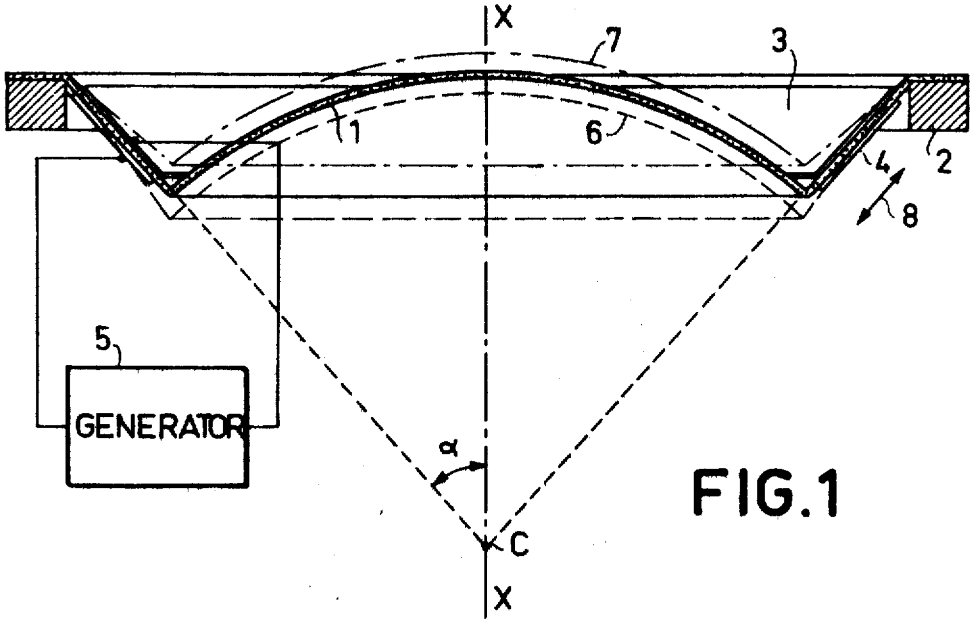
FIG. 1 is a meridan section of a transducer in accordance with the invention.

In FIG. 1, there can be seen the meridian section of an electromechanical transducer in accordance with the invention. This transducer comprises an annular support 2 with an axis of revolution XX to which is fixed a polymer film 1 whose shaping has been such that it has in the center the form of a spherical skullcap with a half-opening angle $\alpha$ having its center C on axis XX. Between the periphery of the skullcap and support 2, this film has the shape of a truncated cone with rectilinear generatrices along the marginal radii of the spherical skullcap. The truncated cone part of the radiating structure of FIG. 1 forms an active suspension. To this end, it is covered on its two faces with electrodes 3 and 4. By way of nonlimiting example, the radiating structure of FIG. 2 may be obtained by thermoshaping a thin film of vinylidene polyfluoride having a thickness of the order of 25 μm. Electrodes 3 and 4 are obtained by thermal evaporation in a vacuum of aluminium to a thickness of 1500 Å. The part of film 1 forming the skullcap has been drawn biaxially whereas the truncated cone-shaped part has been stretched unidirectionally along the radii shown with a broken line. After electric polarization treatment creating between electrodes 3 and 4 a transverse electric field of high intensity (1 MV/cm), the peripheral suspension of the central dome is activated. By connecting electrodes 3 and 4 to an alternating-voltage generator 5, the active peripheral suspension behaves like a piezoelectric transducer. The alternate stretching and contraction of the conical wall of the active peripheral suspension are orientated by construction, as shown by the double arrow 8. The result is that the passive spherical skullcap is urged along its marginal radii which causes movement thereof parallel to axis XX. The broken line 6 shows the low position of the radiating structure and the dash-dot line 7 shows the high position. Although it is not active, the spherical skullcap sweeps a relatively high volume, for the transducer effect is concentrated in the conical suspension with a maximum sensitivity for deformations along the meridians. So as to obtain better mechanical compliance of the active peripheral suspension, the circumferential stiffness may be reduced as shown in FIG. 3. This result is obtained by special shaping which consists in creating radially orientated protuberances 11 which alternate with active sectors 12. Each protuberance 11 provides sealing of the radiating structure, so as to counteract the acoustic short-circuiting between the radiating faces of the vibrating piston. It offers however no circumferential stiffness able to prevent the active sectors 11 from following the translational movement of the central dome. Since the central dome plays a passive role and since it may undergo bending, it may be formed from another material than the truncated cone-shaped active suspension or with another wall thickness. By acting on the piezoelectric parameters and by proportioning the ratio of the active surface to the passive surface taking into consideration the opening angle α, the radiating conditions of a pinpoint source may be approached.

Figure 2:
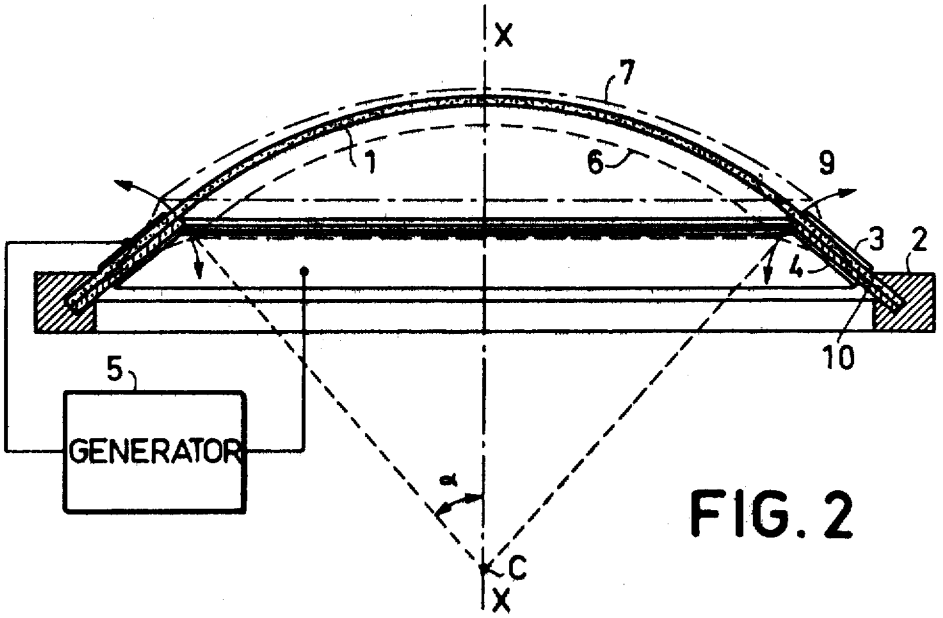
FIG. 2 is a meridian section of another embodiment of the transducer according to the invention.
Figure 3:
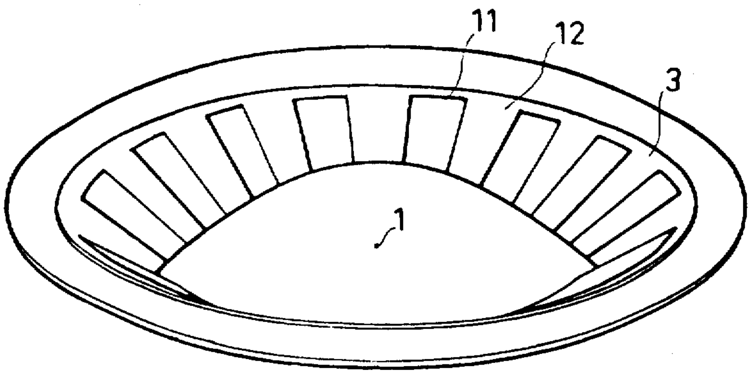
FIGS. 3 and 4 are perspective views of the transucers shown in section in FIGS. 1 and 2.
Figure 4:
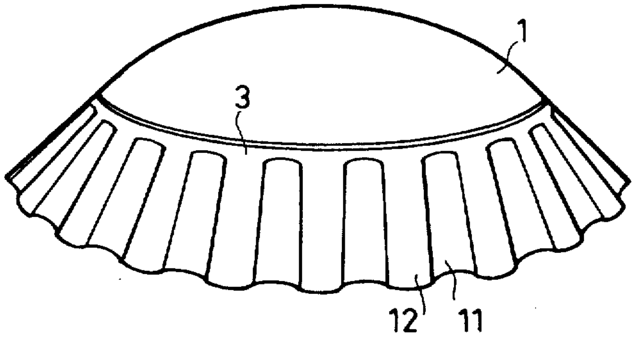

In FIG. 2, there can be seen the meridian section of another embodiment of the radiating structure of FIG. 1. FIG. 4 shows in perspective this variation.

With the same references designating the same elements as in FIGS. 1 and 3, it can be seen that the active peripheral suspension is here of the dimorphous type. The result is a different mounting since the peripheral suspension is embedded in support 2 whereas, in FIG. 1, it could pivot about the support due to a hinge effect at the outer fold. Another difference resides in the fact that the connection between the spherical skullcap and the active truncated cone-shaped suspension does not comprise the 90° folding which can be seen in FIG. 1.

To obtain dimorphous operation, the active suspension of FIG. 2 is provided with a trucated cone-shaped film 10 which adheres perfectly to the truncated cone-shaped part of film 1. By choosing conditions such that the surface deformations of film 1 differ from those of film 10, an alternating bending effect of the dimorphous active suspension can be observed. Along the line of connection with the spherical skullcap, a movement can be observed which is orientated along the marginal radii thereof. This movement is illustrated by the double curved arrow 9 and if reference is made to FIG. 1, it can be seen that it differs little from the movement symbolized by the double arrow 8. As far as the overall movement imparted to the spherical skullcap is concerned, the two types of active suspension are quite comparable. It may be remarked that the mechanical compliance of the active suspension of FIG. 1 is greater than that of the suspension of FIG. 2; the result is that the edge of the spherical skullcap of FIG. 2 moves more accurately along the marginal radii shown with a broken line.

The structures shown in FIGS. 1 and 2 have less directive radiating patterns than those of an active skullcap bearing directly on the securing ring 2.

In accordance with the invention, the radiation of a pinpoint source may be further approximated by arranging for the active suspension and the spherical skullcap to have the same deformations along the connecting circumference.

Figure 5:
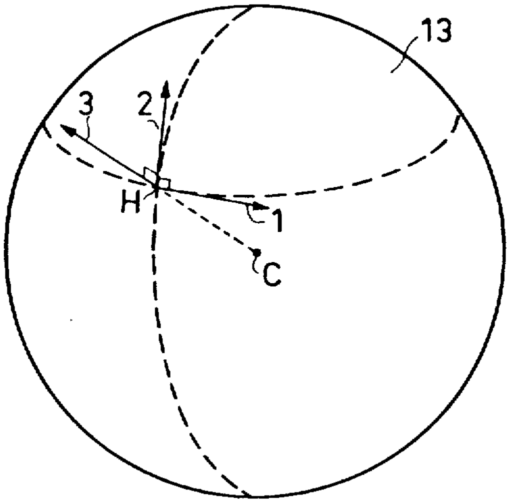
FIGS. 5 to 8 are explanatory figures.

FIG. 5 shows a spherical surface 13 with at point H a system of axes 1, 2, 3. Axis 3 is orientated along a radius, axis 1 is tangential to a parallel and axis 2 is tangential to a meridian.

Figure 6:
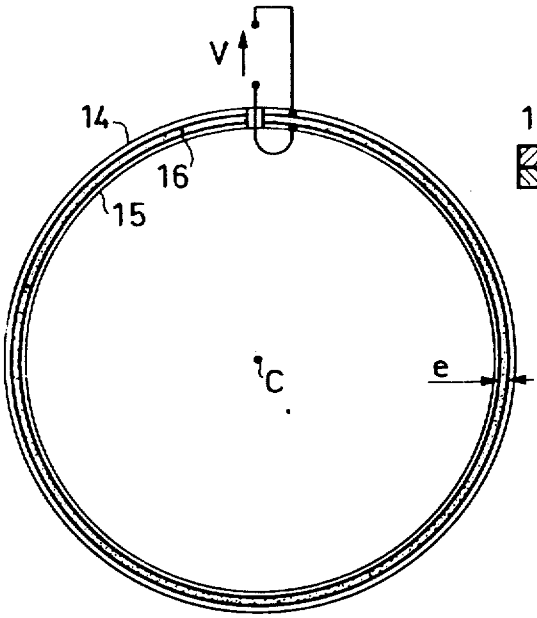

FIG. 6 is a meridian sectional view of a spherical transducer having omnidirectional radiation by spherical waves with phase center C. The polymer film 16 has a wall thickness e and it carries on its external and internal faces metalizations 14 and 15. An orifice is required for making contact with metalization 15. Such a transducer is very delicate to manufacture and it presents the drawback of enclosing a small volume of air which greatly increases the rigidity of the radiating structure.

Figure 7:
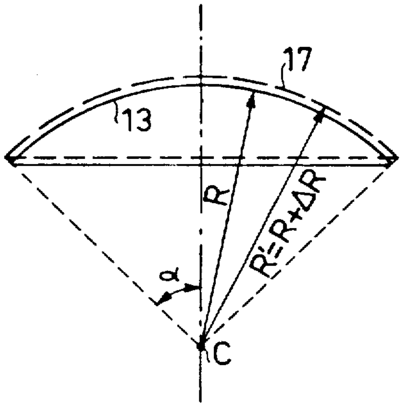
Figure 8:
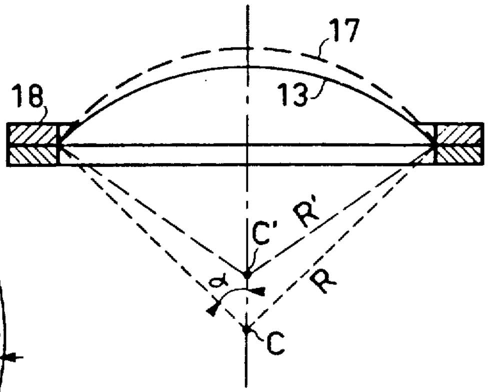

To get over this drawback, it may be imagined that a vibrating piston formed by a spherical-surface portion could emit waves with phase center C. Such a piston is shown in FIG. 7. It is a spherical skullcap 13 with radius R and half-opening angle α. It can be seen that the ideal deformed condition is an expanded skullcap 17 with radius R+ΔR; all the points have undergone a radial displacement ΔR. FIG. 8 shows that securing this spherical skullcap in a rigid annular support 18 does not at all reproduce the purely radial displacement of FIG. 7. The center of curvature passes from C to C′ and the radius of curvature passes from the value R to the value R′.

So that the active spherical skullcap may retain its potential quality of an ideal pulsating skullcap, the invention provides connection thereof by means of an active peripheral suspension which reproduces the conditions at the limits of the pulsating sphere from which it is extracted and which ensures the immobility of center C.

Figure 9:
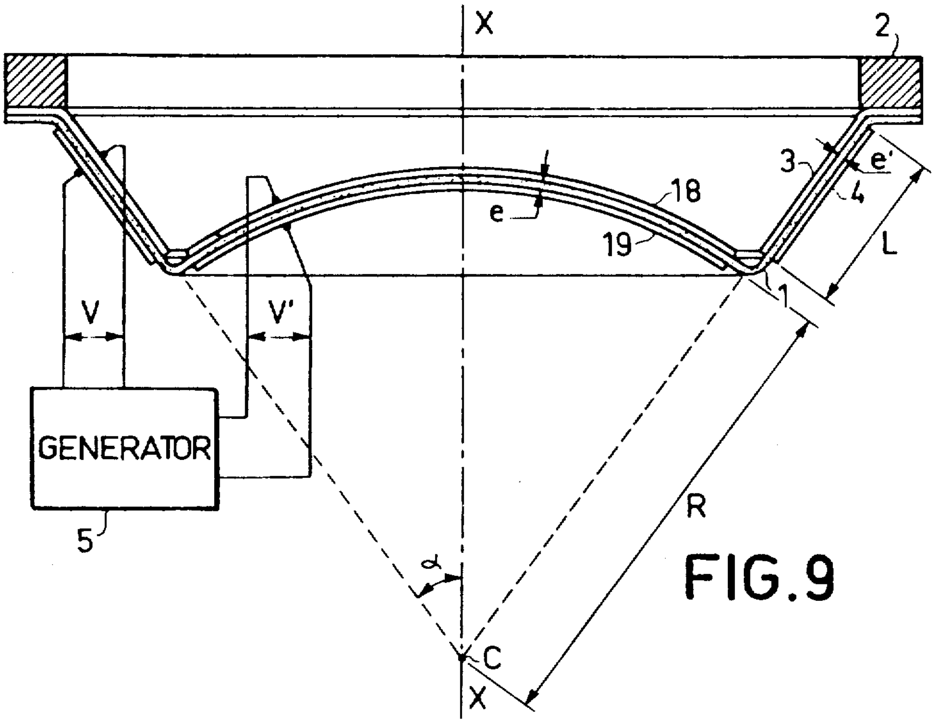
FIG. 9 is a meridian section of another embodiment of the transducer of the invention.

In FIG. 9, there can be seen a meridian section of a radiating structure with fixed phase center. It is formed by stretching a film 1 of vinylidene polyfluoride so as to form a skullcap of thickness e, radius of curvature R and half-opening angle α. This shaping must conserve the isotropy of the piezoelectric properties induced into the skullcap; after electric polarization, this skullcap presents piezoelectric coefficients having for example the following values:

$$d_{31}=d_{32}=5\cdot 10^{-12}\text{C.N.}^{-1}.$$

Shaping by unidirectional stretching has been applied to an active truncated cone-shaped suspension of length L, with semi-opening angle α and thickness e′. The piezoelectric coefficients resulting from this unidirectional stretching and from the electric polarization of the truncated cone-shaped suspension are for example:

$d'_{32}=15\cdot10^{-12}C.N.^{-1}$, $d'_{31}=2\cdot10^{-12}C.N.^{-1}$.

So as to achieve the condition of a neutral connection of the spherical skullcap and the active suspension, $|\Delta R|$ must equal $|\Delta L|$ and the generator 5 must provide voltages V and V' whose polarities are such that if R increases, L decreases.

The calculation of ΔR (radius of curvature variation) is made from the expression:

$$\Delta R = R \cdot d_{31} \cdot (V/e) \quad \ldots (1)$$

The calculation of ΔL (length variation of the suspension) is made from the expression:

$$\Delta L = L \cdot d'_{32} \cdot (V/e') \quad \ldots (2)$$

Assuming for example that V=V' and that e'=e/2, we obtain with R=50 mm:

$$L=(d_{31}/2d'_{32})R$$

whence $$L=(5\cdot10^{-12}\times50)/(2\times15\cdot10^{-12})=8.33 \text{ mm}.$$

Since angle α remains constant, the active suspension vibrates without radiating on its own account. The radiating pattern is solely determined by the pulsating skullcap operation of the central dome.

Figure 10:
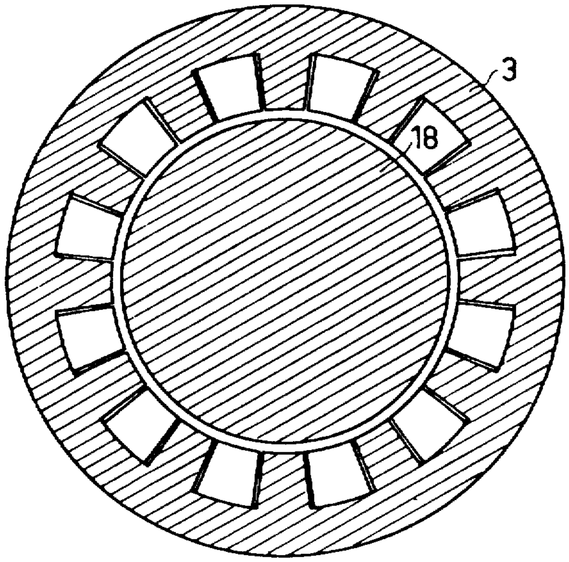
FIG. 10 is a top view of the electrodes equipping the transducer of FIG. 9.

To cause the central dome to operate as an active element, it must be provides with electrodes 18 and 19. FIG. 10 is a top view of the metalizations 3 and 18 borne by the upper face of the polymer film 1. These metalizations 18 and 3 are independent of each other so that the electric polarizations of the spherical skullcap and of the active suspension are made in a sign such that the application of the exciting voltages is facilitated. After polarization, electrodes 18 and 3 may be interconnected if the same exciting voltage is applied to the spherical skullcap and to the peripheral suspension. Electrodes 19 and 4 are arranged in the same way as electrodes 18 and 3. One of the faces of film 1 may be completely metalized without any disadvantage. The use of an active spherical skullcap in the configuration of FIG. 2 is also possible. However, it should be noted that the active suspension of FIG. 2 provides a part of the overall radiation.

The complex relationship of the voltages for exciting the active spherical skullcap and the active peripheral suspension can be not constant. These two elements may be excited with voltages whose amplitudes and phases no longer ensure the neutrality of the deformations on each side of the connecting line except for the high frequencies of the acoustic spectrum. In fact, at low frequencies, a piston not having the characteristics of a pulsating sphere portion may radiate substantially nondirectionally. It is then possible to vary the ratio of the exciting voltages with the frequency with the sole purpose of obtaining an optimized frequency response curve within a predetermned radiation angle.

The manufacture of a structure such as shown in FIG. 9 may be carried out by forming separately the spherical skullcap and the truncated cone-shaped suspension.

Figure 11:
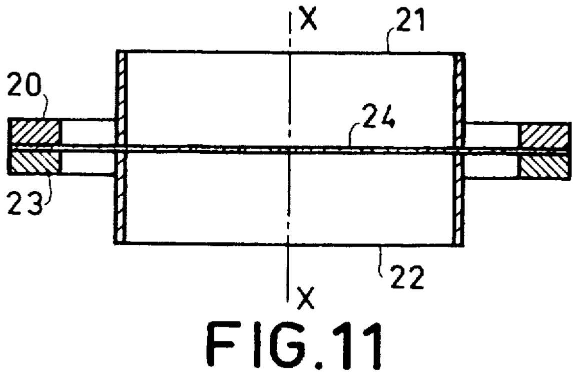
FIGS. 11, 12 and 13 illustrate the process for manufacturing a transducer in accordance with the invention.
Figure 12:
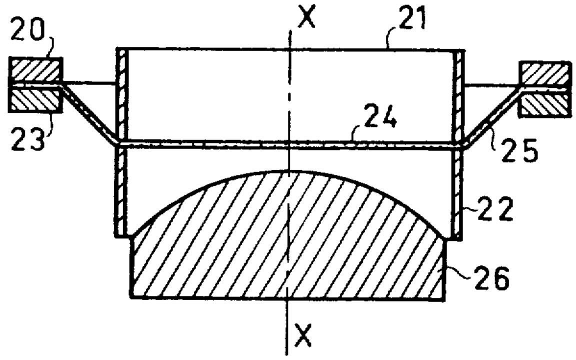
Figure 13:
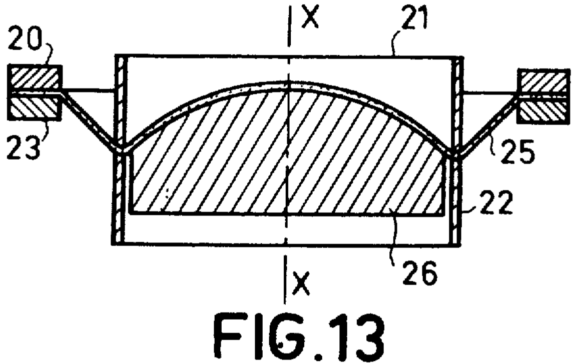

FIGS. 11 to 13 illustrate a manufacturing process for obtaining these two active elements from a flat film of vinylidene polyfluoride. In a first phase, the $PVF_2$ film 24 is nipped in peripheral jaws 20 and 23; it is also nipped between two jaws 21 and 22 as shown in FIG. 11.

In a second phase, jaws 21 and 22 are moved parallel to axis XX so as to stretch uniaxially suspension 25 as shown in FIG. 12.

In a third phase, jaws 20, 21, 22 and 23 remain fixed and a punch 26 will shape the spherical skullcap by biaxial stretching. The condition of the structure is then illustrated by FIG. 13.

The invention is in no wise limited to a passive or active spherical surface portion in the form of a spherical skullcap.

Figure 14:
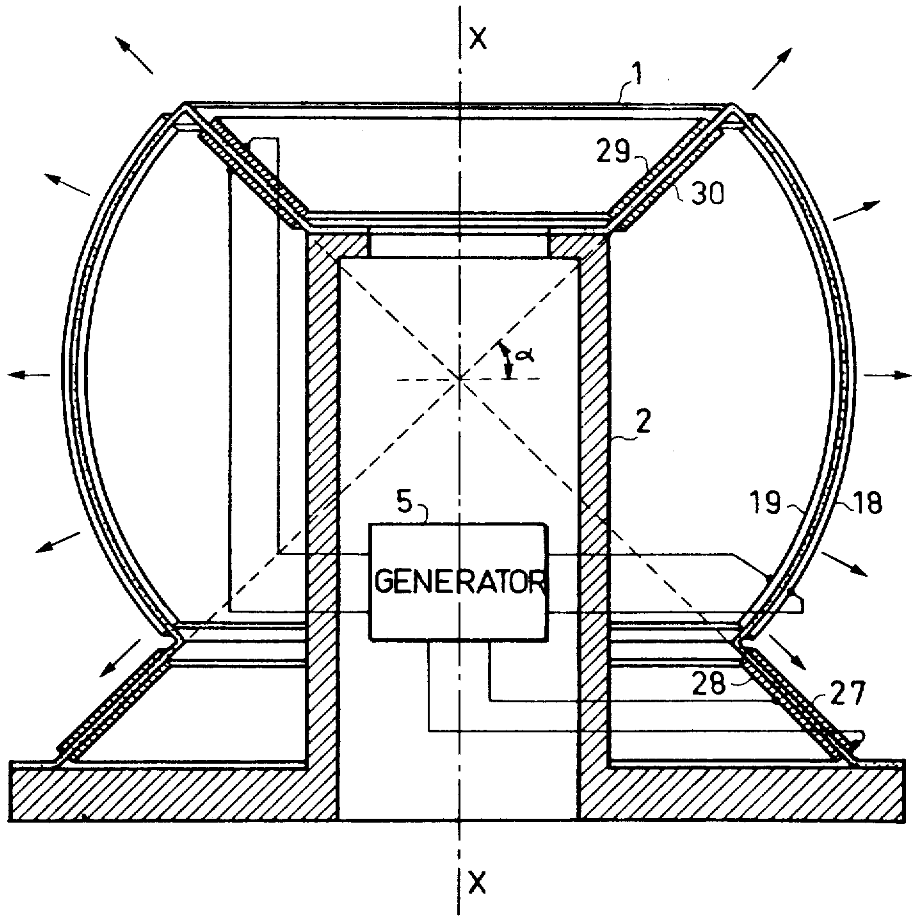
FIG. 14 is a meridian section of an active double-suspension transducer.

In FIG. 14, there can be seen a meridian section of a transducer in accordance with the invention whose principal radiating element is formed by a spherical zone connected to two active truncated cone-shaped peripheral suspensions. The transducer comprises a rigid support 2 on which the two truncated cone-shaped peripheral suspensions bear. The lower suspension is provided with electrodes 27 and 28 whereas the upper suspension has received electrodes 29 and 30. The radiating spherical zone is provided with electrodes 18 and 19. All the electrodes are connected to an exciting generator 5 which provides the pulsating sphere operating condition. Of course, the spherical zone may be purely passive and it is possible to associate therewith an upper passive or active spherical skullcap having the same curvature which is connected to the upper active suspension by means of electrodes 29 and 30.

The manufacture of a spherical zone may take place by blowing into a two-part mold a tube of a polymer material. The truncated cone-shaped suspensions may be added or formed by another operation for stretching the polymer material tube. It can be seen in FIG. 14 that the active truncated cone-shaped suspension may widen out in the direction of the support or on the contrary converge towards the support. This duality of shape applies also to FIGS. 1 and 9. The active suspensions of FIG. 14 may be replaced by dimorphous suspensions as illustrated in FIG. 2. These latter participate in the overall radiation of the radiating structure. One of the suspensions may also be formed as a dimorphous film and the other as a single film. In the case of a skullcap or passive spherical zone, it may be advantageous to form the spherical surface portion from a material having a greater compliance than the active suspensions. For example, polyurethane will be used as passive element and vinylidene polyfluoride as active suspension element.

Although the active suspensions described are made from polymer films, active suspensions must not be dismissed which use electrodynamic or magnetic forces. Undulating active suspension structures must not be dismissed either which may reduce the space requirement of dimorphous structures while providing the bending effects over an effective length greater than their folded length.

Polymer radiating structures are vulnerable to thrusts exerted on their convex face. To provide protection thereof, acoustically permeable cushions may be used which are applied against the concave face. Such measures have been described in French Patent Application No. 80 00311 filed in the name of the applicant on Jan. 8, 1980.

To finish, it should be noted that the invention is in no wise limited to radiating surfaces having symmetry of revolution. The active suspension may take on the shape of a truncated cone or pyramid with a noncircular directrix connecting up with a spherical-surface portion. When the active suspension must reproduce the movements of a pulsating sphere, it is advantageous to cause the apex of the truncated cone or pyramid to coincide with the center of this sphere. On the other hand, the invention is in no wise limited to the spherical-surface portions used as a piston. It also comprises by way of variation pistons having a generally spherical shape, but having a low-amplitude relief for increasing mechanical compliance.

What is claimed is:

1. An elctromechanical transducer comprising:

a rigid support member; and a self supporting radiating structure having a marginal portion attached to said rigid support, said self supporting radiating structure including:

a polymer material active wall having first and second edge regions, said first edge region being attached to said rigid support member, and a closure portion, made of a film shaped in the form of a spherical surface portion, connected to said second edge region of said active wall, said active wall being formed and positioned such that in response to an electrical excitation of said transducer, said second edge moves along marginal radii of said spherical surface portion.

2. A transducer according to claim 1, wherein said active wall is formed in the shape of a truncated pyramid.

3. A transducer according to claim 1, wherein said closure portion is a passive element.

4. A transducer according to claim 1, wherein said closure portion is an active element coated with electrodes on both its faces and having been polarized electrically.

5. A transducer according to claim 1, wherein said closure portion is shaped as a spherical skullcap.

6. A transducer according to claim 1, wherein said closure portion comprises a spherical zone; two active truncated cone-shaped sections being connected to the circular edges of said spherical surface portion.

7. A transducer according to claim 1, wherein said active wall comprises a film deformable along rectilinear generatrices thereof.

8. A transducer according to claim 1, wherein said active wall is a dimorphous structure.

9. A transducer according to claim 1, wherein said active wall comprises protuberances for increasing the compliance thereof.

10. A transducer according to claim 4, wherein the closure portion and the active wall are formed such that when an appropriate electrical excitation is applied to said transducer, a connecting edge of the active suspension simulates in magnitude and in sign the deformation which a pulsating sphere portion completing the closure portion would have imposed.

11. A transducer according to claim 1, wherein said closure portion comprises a relief for increasing compliance thereof.

12. A transducer according to claim 1, further comprising means for protecting against the staving in of convex parts of the radiating structure.

13. A transducer according to claim 1, wherein said active wall is formed in the shape of a truncated cone.

* * * * *